United States Patent [19]

Watanabe et al.

[11] 4,247,949
[45] Jan. 27, 1981

[54] SIGNAL STRENGTH DETECTING CIRCUIT

[75] Inventors: Kazuo Watanabe, Kokubunji; Masanori Ienaka, Kodaira; Yasuo Kominami, Kokubunji; Makoto Homma, Hamura, all of Japan

[73] Assignee: Hitachi, Ltd., Japan

[21] Appl. No.: 10,018

[22] Filed: Feb. 6, 1979

[30] Foreign Application Priority Data

Mar. 29, 1978 [JP] Japan .................. 53-35517

[51] Int. Cl.³ .......................... H04B 1/16; H03J 3/12
[52] U.S. Cl. .................................... 455/154; 455/232; 455/226; 455/177; 363/60; 307/264
[58] Field of Search ............... 325/398, 399, 363, 364, 325/455, 344, 345, 349, 318, 319; 455/253, 333, 226, 214, 154, 177, 232, 233, 234; 363/60; 330/288, 296; 329/179; 307/237, 264

[56] References Cited

U.S. PATENT DOCUMENTS

| | | | |
|---|---|---|---|
| 3,673,499 | 6/1972 | Avins et al. | 325/455 |
| 3,701,022 | 10/1972 | Graft | 363/60 |
| 3,727,138 | 4/1973 | Traub | 325/455 |
| 3,753,120 | 8/1973 | Ohasawa | 455/154 |
| 3,932,768 | 1/1976 | Takahashi et al. | 307/264 |
| 4,059,802 | 11/1977 | Ohsawa et al. | 325/364 |
| 4,109,206 | 8/1978 | Namata | 325/364 |

Primary Examiner—Robert L. Richardson
Assistant Examiner—Tommy P. Chin
Attorney, Agent, or Firm—Craig & Antonelli

[57] ABSTRACT

An input signal is applied to a first limiting amplifier circuit, and an output of the first limiting amplifier circuit is applied to a second limiting amplifier circuit. An output of the second limiting amplifier circuit is applied to a third limiting amplifier circuit. The output signal of the first limiting amplifier circuit is applied to a first detector circuit, the output signal of the second limiting amplifier circuit is applied to a second detector circuit, and the output signal of the third limiting amplifier circuit is applied to a third detector circuit. Bias means for stipulating the bias states of the first, second and third detector circuits are coupled to the third detector circuit. An output signal of the third detector circuit is applied to the second detector circuit as a bias signal, and an output signal of the second detector circuit is applied to the first detector circuit as a bias signal. An output signal of the first detector circuit exhibits a level corresponding to the sum among the output signals of the first, second and third limiting amplifier circuits.

3 Claims, 4 Drawing Figures

SIGNAL STRENGTH DETECTING CIRCUIT

BACKGROUND OF THE INVENTION

This invention relates to a signal strength detecting circuit, and more particularly, to a tuning signal strength detecting circuit in an FM receiver.

As has been known from, for example, U.S. Pat. No. 3,673,499, the detection of tuning signal strength in an FM receiver is effected by utilizing a plurality of peak-to-peak detector circuits to which are applied output signals of a plurality of cascaded stages of limiting amplifier circuit adapted to amplify an FM signal converted into an intermediate frequency and to limit the amplitude of the amplified signal.

The plurality of stages of limiting amplifier circuits execute the amplitude-limiting operations successively from the final stage, depending upon the level of a tuning signal applied to the first stage.

When the corresponding limiting amplifier circuit is in a non-limiting mode of operation, the peak-to-peak detector circuit has its detection signal level varied according to the output signal level of the limiting amplifier circuit.

Accordingly, the level of the input tuning signal is detected on the basis of the detection signals of the plurality of detector circuits. By exploiting the plurality of detector circuits corresponding to the plurality of limiting amplifier circuits in this manner, the detection range of input tuning signals can be widened.

In the detector circuit, the rectifying characteristic of the p-n junction of a semiconductor device can be utilized for the detection. In this case, the detector circuit is enabled to respond to an input signal of low level in such a way that the p-n junction is held forward-biased by e.g. a bias voltage.

The peak-to-peak detector circuit for the tuning and signal strength detecting circuit of this type is described in detail in U.S. Pat. No. 3,701,022. The plurality of peak-to-peak detector circuits are supplied with a fixed bias voltage owing to the forward voltages of a plurality of p-n junction diodes in common. On account of the deviation of the fixed bias voltage from a predetermined value, offset currents flow through the p-n junctions of the respective semiconductor devices. Therefore, the total offset current becomes great.

SUMMARY OF THE INVENTION

An object of this invention is to provide a tuning signal strength detecting circuit which delivers a detection signal exhibiting a small offset and corresponding well with a tuning signal strength.

Another object of this invention is to provide a tuning signal strength detecting circuit which is suited to a semicondutor integrated circuit.

DESCRIPTION OF THE PREFERRED EMBODIMENTS

In accordance with this invention, the detection signal of one detector circuit is used for the forward bias or biases of another detector circuit or other detector circuits as described above.

The detector circuit delivers to an output terminal a voltage or current corresponding to the supplied forward bias voltage or current. In a desirable construction, accordingly, a bias signal is supplied from one detector circuit to another detector circuit, from which a bias signal is similarly supplied to still another circuit. According to this construction, a detection signal which corresponds to the sum among the output signals of the plurality of detector circuits is provided at the output terminal of the final detector circuit.

In a more desirable construction, the detector circuit corresponding to the final stage of limiting amplifier circuit is made the first stage, and the bias signals are supplied from this first stage to the succeeding stages.

Figure 1:
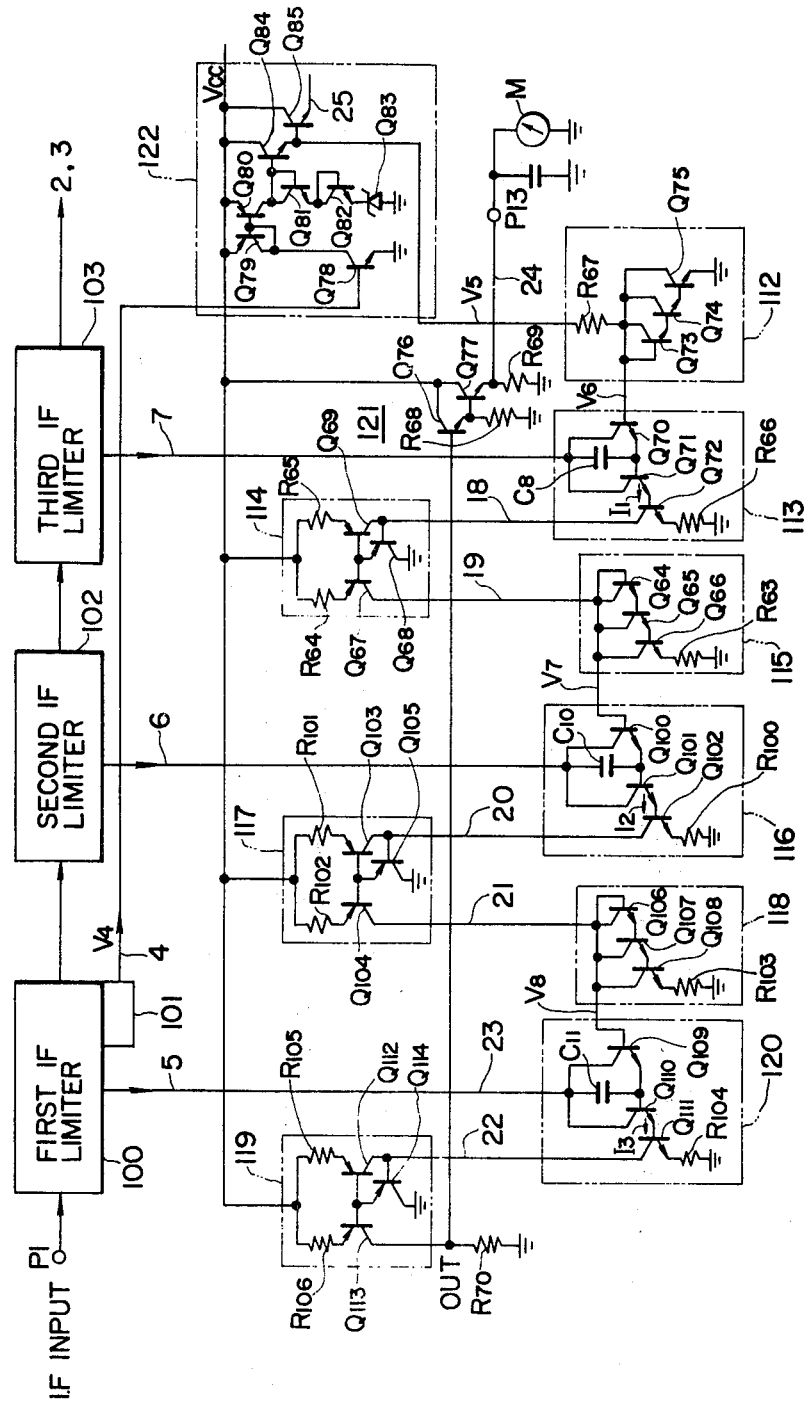
FIG. 1 shows a tuning and signal strength detecting circuit according to an embodiment of this invention.

FIG. 1 shows a circuit representing an exemplary embodiment of the present invention. This circuit is fabricated in the form of a semiconductor integrated circuit unless otherwise specified.

Referring to the figure, numerals 113, 116 and 120 designate peak-to-peak detector circuits, numerals 114, 117 amd 119 current mirror circuits, numeral 112 a bias circuit, and numerals 115 and 118 current-voltage converting circuits.

Output signals of the first, second and third stages of the limiting amplifier circuits 100, 102 and 103 are respectively applied to the first, second and third detector circuits 120, 116 and 113 through lines 5, 6 and 7.

Figure 2:
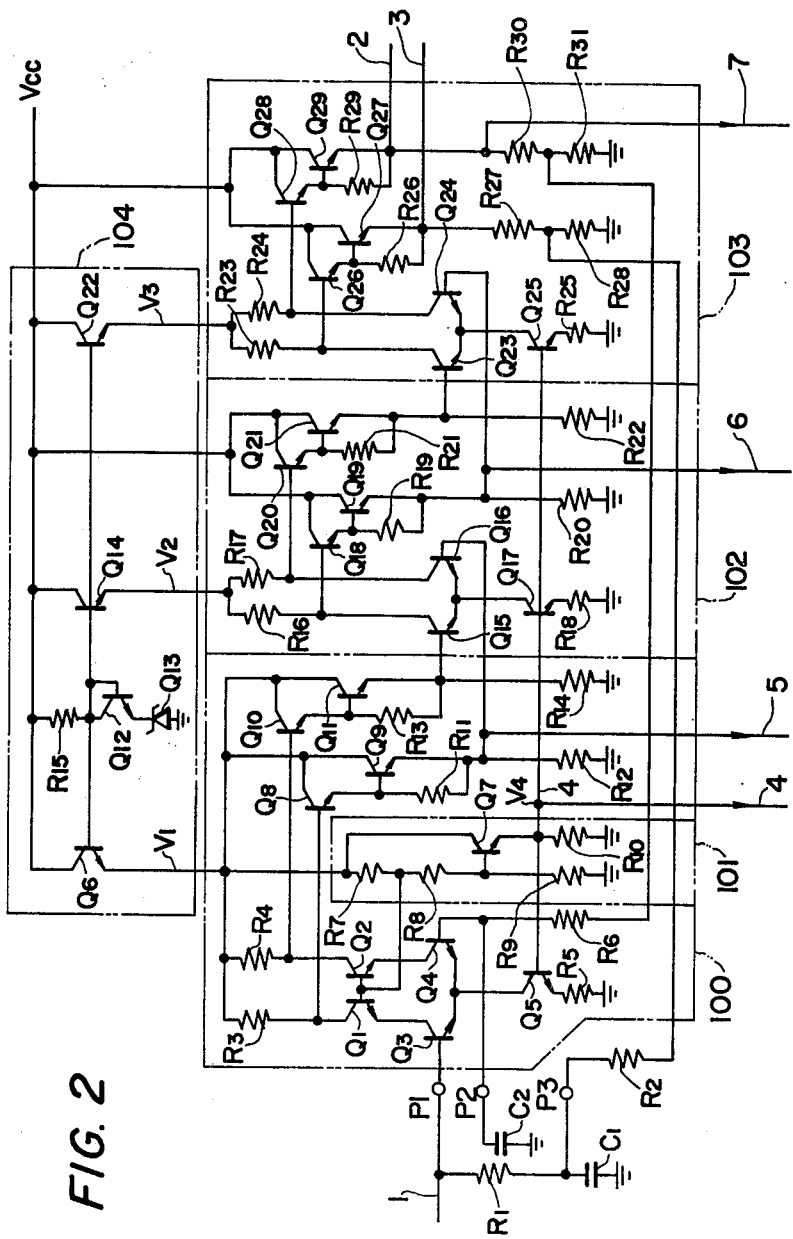
FIG. 2 shows a plurality of cascaded limiting amplifier circuits in FIG. 1, and FIGS. 3 and 4 are diagrams which illustrate the operation of the circuit of FIG. 1.

These limiting amplifier circuits are enclosed with broken lines 100, 102 and 103 in the illustration of FIG. 2, and each is constructed of a differential amplifier circuit and a pair of emitter-follower circuits. The respective limiting amplifier circuits 100, 102 and 103 are supplied with constant supply voltages $V_1$, $V_2$ and $V_3$ from a voltage regulator circuit 104 which utilizes a supply voltage $V_{cc}$. A bias circuit 101 feeds a line 4 with a bias voltage $V_4$ for operating various constant-current transistors.

In the first stage limiting amplifier circuit 100, an intermediate-frequency FM signal applied to one input terminal $P_1$ through a line 1 is amplified. The other input terminal $P_2$ is A.C.-grounded by a capacitor $C_2$. The second and third stages limiting amplifier circuits 102 and 103 receive differential input signals and deliver differential output signals, respectively. The differential output of the third stage limiting amplifier circuit 103 is applied to an FM demodulation circuit (not shown) through a line 2 or 3.

The circuit of FIG. 1 is preferably constructed as a single integrated circuit.

In FIG. 1, the third detector circuit 113 is composed of transistors $Q_{70}$ to $Q_{72}$, a resistor $R_{66}$ and a capacitor $C_8$. A bias voltage $V_6$ from the bias circuit 112 is received at the base of the transistor $Q_{70}$, and the output signal of the third stage limiting amplifier circuit 103 is received at the collectors of the transistors $Q_{70}$ and $Q_{71}$ and one end of the capacitor $C_8$, which are connected in common.

In order to satisfactorily detect a detection signal in the third detector 113 even when it is of a low level, the transistors $Q_{70}$ to $Q_{72}$ are biased so that they may not fall into the perfect non-conductive state even when dispersions or deviations in the characteristics of circuit elements are involved. That is, the transistors $Q_{70}$ to $Q_{72}$ are biased so as to cause some offset current.

The bias circuit 112 is composed of a resistor $R_{67}$ and transistors $Q_{73}$ to $Q_{75}$. These three transistors receive a constant output voltage $V_5$ from a voltage regulator circuit 122 through the resistor $R_{67}$, thereby to generate the bias voltage $V_6$ which is substantially equal to the sum of the base-emitter voltages of the three transistors $Q_{70}$ to $Q_{72}$ of the detector circuit 113.

The offset current of the transistors $Q_{70}$ to $Q_{72}$ can be appropriately changed in dependence on the resistances of the resistors $R_{67}$ and $R_{66}$.

The collector current of the transistor $Q_{72}$ of the third detector circuit 113 becomes an input current of the third current mirror circuit 114.

The third current mirror circuit 114 is composed of p-n-p transistors $Q_{67}$ to $Q_{69}$, and resistors $R_{64}$ and $R_{65}$. It transmits an output current corresponding to the input current at, for example, one to one.

The second current-voltage converting circuit 115 is composed of transistors $Q_{64}$ to $Q_{66}$ and a resistor $R_{63}$. It receives the output current of the current mirror circuit 114, and produces a bias voltage $V_7$ corresponding to this current by means of the transistors $Q_{64}$ to $Q_{66}$ and the resistor $R_{63}$.

The output voltage $V_7$ of the second current-voltage converter circuit 115 becomes a bias voltage of the detector circuit 116 which includes transistors $Q_{100}$ to $Q_{102}$, a resistor $R_{100}$ and a capacitor $C_{10}$. The collector current of the transistor $Q_{102}$ of the second detector circuit 116 becomes an input current of the second current mirror circuit 117.

The second current mirror circuit 117 consists of p-n-p transistors $Q_{103}$ to $Q_{105}$ and resistors $R_{101}$ and $R_{102}$. It transmits an output current corresponding to the input current at, for example, one to one.

The first current-voltage converting circuit 118 consists of transistors $Q_{106}$ to $Q_{108}$ and a resistor $R_{103}$. It receives the output current of the second current mirror circuit 117, and generates a voltage $V_8$ corresponding to this current by means of the transistors $Q_{106}$ to $Q_{108}$ and the resistor $R_{103}$.

The output voltage $V_8$ of the first current-voltage converter circuit 118 becomes a bias voltage of the first detector circuit 120 which includes transistors $Q_{109}$ to $Q_{111}$, a resistor $R_{104}$ and a capacitor $C_{11}$. The collector current of the transistor $Q_{111}$ of the first detector circuit 120 becomes an input current of the first current mirror circuit 119.

The first current mirror circuit 119 is composed of p-n-p transistors $Q_{112}$ to $Q_{114}$ and resistors $R_{105}$ and $R_{106}$. It transmits an output current corresponding to the input current at, for example, one to one. It causes the current corresponding to the output current of the first detector circuit 120 to flow through a resistor $R_{70}$. An output voltage is generated across the resistor $R_{70}$.

By receiving the output signals of the limiting amplifier circuits 103, 102 and 100, the respective detector circuits 113, 116 and 120 provide signals corresponding to these signals and the bias voltages.

The respective limiting amplifier circuits perform amplitude-limiting operations in dependence on the FM signal level supplied to the line 1.

Figure 3:
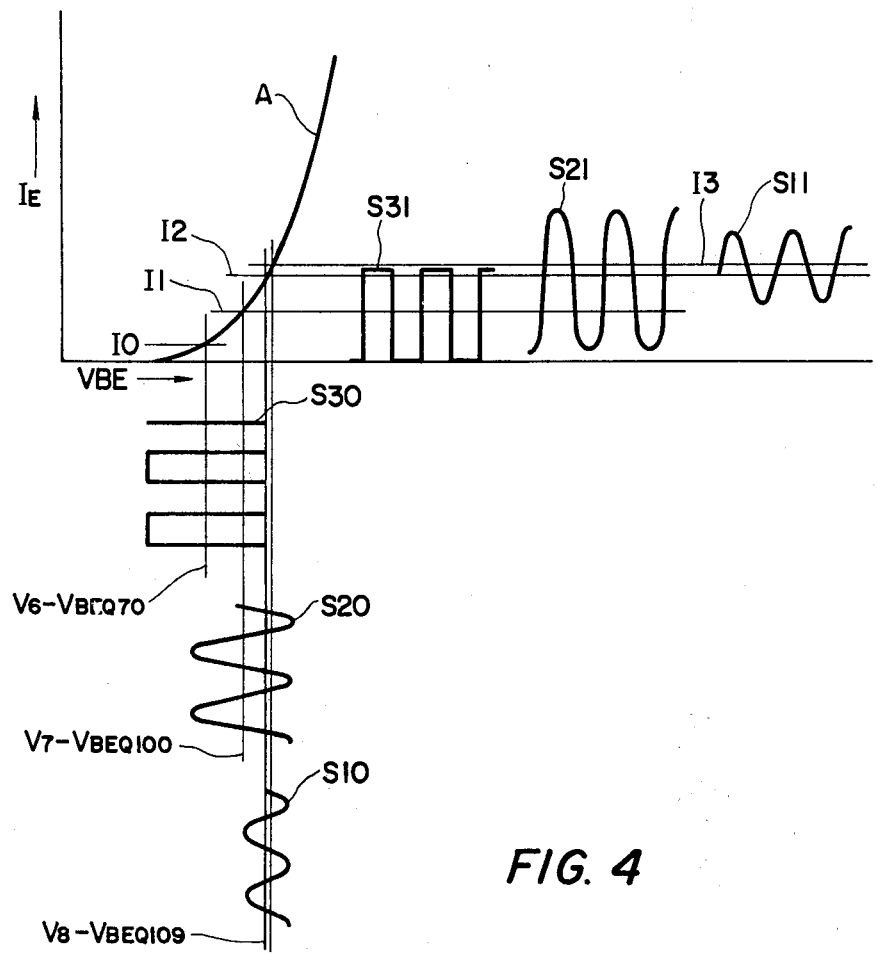

FIG. 3 is a diagram for explaining the operation of the circuit of the exemplary embodiment. The figure illustrates a case where the first and second stage limiting amplifier circuits 100 and 102 are in the non-amplitude-limiting mode of operation and where the third stage limiting amplifier circuit 103 is in the amplitude-limiting mode of operation.

In the third detector circuit 113, the transistor $Q_{71}$ has an emitter current-versus-base-emitter voltage characteristic as indicated by a curve A. A bias voltage ($V_6 - V_{BE\,Q70}$) is applied to the base of the transistor $Q_{71}$. Here, $V_{BE\,Q70}$ signifies the base-emitter forward voltage of the transistor $Q_{70}$.

The base of the transistor $Q_{71}$ is supplied with a signal as indicated by a waveform $S_{30}$ from the third stage of limiting amplifier circuit 103 through the capacitor $C_8$. The transistor $Q_{71}$ exhibits a rectifying characteristic for this signal. As a result, the emitter current of the transistor $Q_{71}$ varies as depicted by a waveform $S_{31}$, and the average current thereof increases from the level of the offset current $I_0$ to a current $I_1$.

Owing to the current increase, the emitter potential of the transistor $Q_{71}$ or the base potential of the transistor $Q_{72}$ rises.

In consequence, the collector current of the transistor $Q_{72}$ increases. Owing to this collector current, the output bias voltage $V_7$ of the second current-voltage converter circuit 115 rises. In this case, the signal applied to the base of the transistor $Q_{71}$ is at a comparatively high frequency. Therefore, the signal rectified by the transistor $Q_{71}$ is sufficiently smoothed by stray capacitances in various parts (not shown) such as stray capacitance at the juncture between the emitter of the transistor $Q_{71}$ and the base of the transistor $Q_{72}$ and stray capacitance at the juncture between the collectors of the transistors $Q_{72}$ and $Q_{69}$.

Owing to the increase of the output bias voltage $V_7$ of the second current-voltage converter circuit 115, the base-emitter bias voltage of the transistor $Q_{101}$ in the second detector circuit 116 becomes a voltage ($V_7 - V_{BE\,Q100}$) higher than that of the transistor $Q_{71}$ as shown in FIG. 3. Here, $V_{BE\,Q100}$ denotes the base-emitter forward voltage of the transistor $Q_{100}$.

The second detector circuit 116 provides an emitter current as depicted at $S_{21}$ in FIG. 3 in response to that signal as depicted by a waveform $S_{20}$ in the figure which is applied from the second stage limiting amplifier circuit 102 to the base of the transistor $Q_{101}$. The average emitter current becomes a value $I_2$ which is equal to the sum between the current $I_1$ increased by the output of the first stage detector circuit 113 and the current increased by the signal $S_{20}$.

The second stage detector circuit 116 generates the further increased bias voltage $V_8$ in the second current-voltage converter circuit 118.

The base voltage of the transistor $Q_{110}$ in the first detector circuit 120 becomes ($V_8 - V_{BE\,Q109}$) (where $V_{BE\,Q109}$ denotes the base-emitter forward voltage of the transistor $Q_{109}$). The emitter current of the transistor $Q_{110}$ becomes as shown by a waveform $S_{11}$ in FIG. 3 in response to the signal from the first stage of limiting amplifier circuit 100 as shown at $S_{10}$ in the figure, and the average current has a value $I_3$.

As apparent from the above explanation, the average current $I_3$ becomes the substantial sum among the output signals of the individual detector circuits 113, 116 and 120.

The output current of the first detector circuit 120 is applied to the first current mirror circuit 119. The output current of the first current mirror circuit 119 is supplied to the resistor $R_{70}$.

In this embodiment, the bias of the second stage of detector circuit 116 is determined by the output of the first stage detector circuit 113, and the bias of the third stage detector circuit 120 is determined by the output of the second stage detector circuit 116.

Accordingly, merely the offset current of the third stage detector circuit 120 flows through the resistor $R_{70}$.

In contrast, if as disclosed in U.S. Pat. No. 3,701,022 the bias circuit 112 and the current-voltage converter circuits 115 and 118 are supplied with a fixed bias voltage from the voltage regulator circuit 122 in common, the outputs of the respective detector circuits 113, 116 and 120 are connected in common and a load resistor is connected between the common connection point and the power supply $V_{cc}$, then the offset currents of the three detector circuits will flow through the load resistor.

Figure 4:
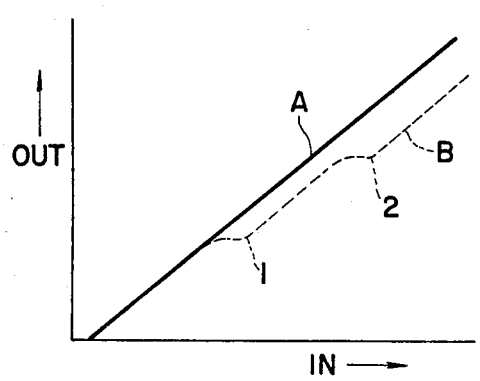

In this embodiment, the output of the detector circuit determines the bias voltage of the succeeding detector circuit as described above. Therefore, even when the fixed bias voltage from the bias circuit 112 is somewhat low, the signal IN applied to the line 1 and the detection signal OUT obtained at the resistor $R_{70}$ are proportional substantially rectilinearly as indicated by a curve A in FIG. 4. The detection signal OUT is delivered to a terminal $P_{13}$ through an output circuit 121 which is made up of transistors $Q_{76}$ and $Q_{77}$ and resistors $R_{68}$ and $R_{69}$, and it drives a tuning meter M.

In contrast, when in the tuning and signal strength detecting circuit proposed in U.S. Pat. No. 3,701,022 the bias voltage is lowered to the end of, for example, reducing the offset currents, the detection of low level signals becomes difficult in the respective detector circuits. In some cases, therefore, e.g. until the output signal level of the second stage of limiting amplifier circuit 102 becomes sufficiently great after the third stage of limiting amplifier circuit 103 has started the amplitude-limiting operation, the detector circuit corresponding to the second stage limiting amplifier circuit does not satisfactorily respond to the increase of the level of the FM intermediate frequency signal, and the detection signal OUT is not rectilinear as shown by a broken line B in FIG. 4.

This invention is not restricted to the foregoing embodiment. By way of example, although in the arrangement of FIG. 1 the detection outputs of the detector circuits are supplied to the current mirror circuits in the form of currents and they are converted into voltage by the current-voltage converted circuits 115 and 118, it is allowed to omit the current-voltage converter circuits 115 and 118 and to apply the biases to the succeeding detector circuits directly from the current mirror circuits.

What is claimed is:

1. A signal strength detecting circuit comprising:
    a plurality of cascaded signal amplifying stages;
    a plurality of detecting circuits including at least a first stage detecting circuit and a final stage detecting circuit, each one of the detecting circuits being coupled to each one of said amplifying stages;
    a bias circuit connected to the final stage detecting circuit;
    a current mirror circuit, the input of which is coupled to the output of said final stage detecting circuit;
    a current-voltage converter circuit, the input of which is coupled to the output of said current mirror circuit, a bias voltage generated at the output of the current-voltage converter being transmitted to the first stage detecting circuit;
    another current mirror circuit, the input of which is coupled to the output of said first stage detecting circuit;
    an additional current-voltage converter means coupled to the output of said other current mirror circuit; and
    means responsive to the output of said additional current-voltage converter means to provide an indication of received signal strength.

2. A signal strength detecting circuit comprising:
    a first stage limiting amplifier circuit, the input of which receives an intermediate-frequency signal;
    a second stage limiting amplifier circuit, the input of which is coupled to the output of said first stage limiting amplifier circuit;
    a third stage limiting amplifier circuit, the input of which is coupled to the output of said second stage limiting amplifier circuit;
    a first detector circuit coupled to said first stage limiting amplifier circuit;
    a second detector circuit coupled to said second stage limiting amplifier circuit;
    a third detector circuit coupled to said third stage limiting amplifier circuit;
    a first current mirror circuit, the input of which is coupled to the output of said detector circuit;
    a second current mirror circuit, the input of which is coupled to the output of said second detector circuit;
    a third current mirror circuit, the input of which is coupled to the output of said third detector circuit;
    a first current-voltage converter circuit, the input of which is coupled to the output of said second current mirror circuit, a first bias voltage generated at the output of the first current-voltage converter circuit being applied to said first detector circuit;
    a second current-voltage converter circuit, the input of which is coupled to the output of said third current mirror circuit, a second bias voltage generated at the output of the second current-voltage converter circuit being applied to said second detector circuit;
    an additional current-voltage converter means coupled to the output of said first current mirror circuit;
    a bias circuit connected to said third detector circuit so as to apply a third bias voltage thereto; and
    means responsive to the output of said additional current-voltage converter means to provide an indication of said intermediate-frequency signal.

3. A signal strength detecting circuit according to claim 2, further comprising a voltage regulator circuit coupled to said bias circuit so as to supply a fixed bias voltage thereto.

* * * * *